(12) United States Patent
Adams et al.

(10) Patent No.: US 10,793,420 B2
(45) Date of Patent: Oct. 6, 2020

(54) ELECTRONIC SYSTEMS WITH THROUGH-SUBSTRATE INTERCONNECTS AND MEMS DEVICE

(71) Applicant: Kionix, Inc., Ithaca, NY (US)

(72) Inventors: Scott G. Adams, Ithaca, NY (US); Charles W. Blackmer, Ithaca, NY (US)

(73) Assignee: Kionix, Inc., Ithaca, NY (US)

( * ) Notice: Subject to any disclaimer, the term of this patent is extended or adjusted under 35 U.S.C. 154(b) by 14 days.

(21) Appl. No.: 15/941,465

(22) Filed: Mar. 30, 2018

(65) Prior Publication Data

US 2018/0222746 A1 Aug. 9, 2018

Related U.S. Application Data

(62) Division of application No. 14/790,378, filed on Jul. 2, 2015, now Pat. No. 10,315,915.

(51) Int. Cl.
| | |
|---|---|
| *H01L 29/40* | (2006.01) |
| *B81B 7/00* | (2006.01) |
| *B81C 1/00* | (2006.01) |
| *H01L 21/306* | (2006.01) |
| *H01L 21/768* | (2006.01) |

(Continued)

(52) U.S. Cl.
CPC .......... *B81B 7/007* (2013.01); *B81C 1/00301* (2013.01); *H01L 21/30604* (2013.01); *H01L 21/76898* (2013.01); *H01L 23/481* (2013.01); *H01L 23/5329* (2013.01); *B81B 2207/096* (2013.01); *B81C 2201/013* (2013.01)

(58) Field of Classification Search
CPC ................ B81B 7/007; B81C 1/00301; H01L 21/30604; H01L 21/76898; H01L 23/481; H01L 23/5329

USPC ......................................................... 257/621
See application file for complete search history.

(56) References Cited

U.S. PATENT DOCUMENTS

| | | |
|---|---|---|
| 5,879,838 A | 3/1999 | Lee |
| 6,028,347 A | 2/2000 | Sauber et al. |

(Continued)

FOREIGN PATENT DOCUMENTS

| | | |
|---|---|---|
| DE | 102011088581 A1 | 9/2012 |
| WO | WO 2003/062137 A2 | 7/2003 |
| WO | WO 2008/088032 A1 | 7/2008 |

OTHER PUBLICATIONS

International Search Report and Written Opinion for International Application No. PCT/US2016/039859, European Patent Office, dated Jun. 10, 2016, 9 pages.

*Primary Examiner* — Nitin Parekh
(74) *Attorney, Agent, or Firm* — Sterne, Kessler, Goldstein & Fox P.L.L.C.

(57) ABSTRACT

Disclosed is a method of forming an interconnect in a substrate having a first surface and a second surface. The method includes forming an insulating structure abutting the first surface and defining a closed loop around a via in the substrate and forming an insulating region abutting the second surface such that the insulating region contacts the insulating structure and separates the via from a bulk region of the substrate. Forming the insulating structure includes etching the substrate beginning from the first surface to form a trench, filling the trench to form a seam portion, and converting a first portion of the substrate to a first solid portion to form the closed loop.

18 Claims, 13 Drawing Sheets

(51) Int. Cl.
   *H01L 23/48*   (2006.01)
   *H01L 23/532*  (2006.01)

(56) References Cited

U.S. PATENT DOCUMENTS

| | | | |
|---|---|---|---|
| 6,163,065 A | 12/2000 | Seshan et al. | |
| 6,342,430 B1 | 1/2002 | Adams et al. | |
| 6,480,385 B2 | 11/2002 | Seshan | |
| 6,815,827 B2 | 11/2004 | Vieux-Rochaz et al. | |
| 6,838,362 B2 | 1/2005 | Mastromatteo et al. | |
| 6,858,355 B2 | 2/2005 | Wang et al. | |
| 6,921,959 B2 | 7/2005 | Watanabe | |
| 7,129,163 B2 * | 10/2006 | Sherrer | G02B 6/4201 438/637 |
| 7,153,718 B2 * | 12/2006 | Fischer | B81B 7/0006 438/55 |
| 7,227,213 B2 | 6/2007 | Mastromatteo et al. | |
| 7,411,257 B2 | 8/2008 | Yoshizawa et al. | |
| 7,728,339 B1 | 6/2010 | Adams et al. | |
| 7,808,111 B2 * | 10/2010 | Trezza | H01L 21/76898 257/774 |
| 7,829,925 B2 | 11/2010 | Sakoh et al. | |
| 7,943,470 B2 | 5/2011 | Uchiyama | |
| 8,018,030 B2 | 9/2011 | Furusawa et al. | |
| 8,159,254 B2 | 4/2012 | Kaltalioglu | |
| 8,319,254 B2 | 11/2012 | Adams et al. | |
| 8,354,735 B2 | 1/2013 | Lee et al. | |
| 8,647,920 B2 | 2/2014 | Tezcan et al. | |
| 8,664,731 B2 | 3/2014 | Blackmer et al. | |
| 8,772,126 B2 | 7/2014 | Schulze et al. | |
| 8,809,969 B2 | 8/2014 | Tarui et al. | |
| 8,987,067 B2 | 3/2015 | Barry et al. | |
| 9,070,683 B2 | 6/2015 | Fender et al. | |
| 9,082,781 B2 | 7/2015 | Filippi et al. | |
| 9,425,328 B2 * | 8/2016 | Marx | B81B 7/0041 |
| 2007/0102792 A1 | 5/2007 | Wu | |
| 2012/0139127 A1 | 6/2012 | Beyne | |
| 2012/0211872 A1 | 8/2012 | Kawano et al. | |
| 2012/0248581 A1 * | 10/2012 | Sugiyama | H01L 21/76898 257/622 |
| 2012/0315738 A1 | 12/2012 | Kobayashi | |
| 2013/0026599 A1 | 1/2013 | Nakamura et al. | |
| 2013/0127019 A1 | 5/2013 | Lee et al. | |
| 2014/0048909 A1 * | 2/2014 | Golda | H02N 13/00 257/619 |
| 2014/0217560 A1 * | 8/2014 | Fujita | H01L 23/481 257/621 |
| 2014/0374916 A1 | 12/2014 | Bu et al. | |
| 2015/0276532 A1 * | 10/2015 | Adams | G01L 13/021 73/724 |

* cited by examiner

ELECTRONIC SYSTEMS WITH THROUGH-SUBSTRATE INTERCONNECTS AND MEMS DEVICE

CROSS REFERENCE TO RELATED APPLICATION

This application is a divisional of U.S. application Ser. No. 14/790,378, filed Jul. 2, 2015, which is hereby incorporated herein in its entirety by reference.

BACKGROUND

Field of the Invention

The present invention generally relates to electronic systems, and more particularly to electronic systems with interconnects.

Background

A through-silicon via (TSV), also known as a through-substrate via, is an interconnect structure formed in a substrate that provides a vertical electrical connection passing completely through the substrate.

There are multiple ways to categorize a TSV architecture. One categorization is based on when TSV fabrication process is performed in relation to a CMOS or a MEMS device fabrication process. For example, in a TSV-first architecture, TSVs are completely formed in a substrate prior to forming CMOS or MEMS devices in the same substrate. In a TSV-middle architecture, TSVs are partially formed first and then completed after forming, or partially forming, CMOS or MEMS devices.

Another categorization is based on the conducting material that is used for the through-substrate conduction. In an example, holes are etched in a substrate and lined with a dielectric. The hole is filled with a conducting material, such as copper. In subsequent fabrication steps, electrical contacts are made to the top and bottom of the filled conducting TSV plug. In another example, a continuous trench is etched partially through the substrate in a closed pattern, such as an annulus. The trench is then partially filled with a dielectric material. Electrical connection is made to the surrounded silicon using a metal trace and a via opening. In subsequent fabrication steps, the substrate is flipped over; an electrical connection, such as a bond pad or solder bump, is made; and, a second trench that intersects with the continuous trench is etched, thereby removing the only remaining electrical connection between the surrounding substrate and the silicon plug inside the closed contour filled with a dielectric material. A similar process is described in U.S. Pat. No. 6,815,827.

In an alternative process, the silicon plug is doped to create a resistivity within the plug that is lower than that of the surrounding substrate. A similar process is described in U.S. Pat. Nos. 7,227,213 and 6,838,362.

TSV is commonly used for 3D/2.5D integration of integrated circuits because of its ability to electrically couple two or more substrates that are stacked on top of each other and because of its superior performance compared to conventional interconnects. However, despite these benefits, it is not widely used in the field because it is currently too expensive to fabricate. Therefore, there is a need for a new TSV structure that has a lower fabrication cost than a conventional TSV structure.

SUMMARY

According to an embodiment, an interconnect formed in a substrate having a first surface and a second surface includes a bulk region. A via extends from the first surface to the second surface. An insulating structure extends through the first surface into the substrate and defines a closed loop around the via, wherein the insulating structure comprises a seam portion separated by at least one solid portion. And, an insulating region extends from the insulating structure toward the second surface. The insulating region separates the via from the bulk region, wherein the insulating structure and insulating region collectively provide electrical isolation between the via and the bulk region.

According to another embodiment, an electronic component includes a substrate having a first surface and a second surface, and the substrate includes an interconnect formed in the substrate. The interconnect includes a bulk region. A via extends from the first surface to the second surface. An insulating structure extends through the first surface into the substrate and defines a closed loop around the via, wherein the insulating structure comprises a seam portion separated by at least one solid portion. And, an insulating region extends from the insulating structure toward the second surface. The insulating region separates the via from the bulk region, wherein the insulating structure and insulating region collectively provide electrical isolation between the via and the bulk region.

According to another embodiment, a method of forming an interconnect in a substrate having a first surface and a second surface is provided. The method includes forming an insulating structure abutting the first surface and defining a closed loop around a via in the substrate and forming an insulating region abutting the second surface such that the insulating region contacts the insulating structure and separates the via from a bulk region of the substrate. The forming of the insulating structure includes etching the substrate beginning from the first surface to form a trench; filling the trench to form a seam portion; and converting a portion of the substrate to a solid portion to form the closed loop.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 1A:
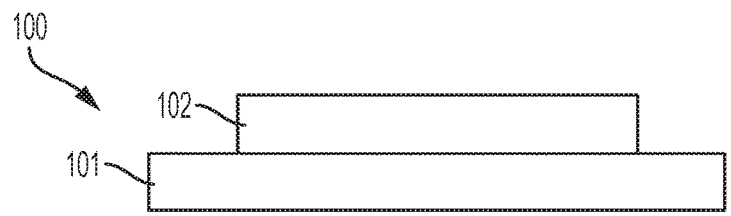
FIG. 1A illustrates an electronic system, according to an embodiment.

The present disclosure will now be described with reference to the accompanying drawings. In the drawings, like reference numbers generally indicate identical or similar elements. Additionally, generally, the left-most digit(s) of a reference number identifies the drawing in which the reference number first appears.

DETAILED DESCRIPTION

I. Overview

Embodiments of the invention lower the cost and improve the strength of the resulting TSV structure. Embodiments break a single seam portion of an insulating structure into multiple segments using one or more solid portions to enhance the resulting strength of the TSV structures. Embodiments may also share a process step with a MEMS device fabrication process to further reduce the cost and may not require additional process steps to form a TSV and a MEMS device in the same substrate.

The following Detailed Description refers to accompanying drawings to illustrate embodiments consistent with the disclosure. The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

The embodiments described herein are provided for illustrative purposes, and are not limiting. Other embodiments are possible, and modifications may be made to the embodiments within the spirit and scope of the disclosure. Therefore, the Detailed Description is not meant to limit the present disclosure. Rather, the scope of the present disclosure is defined only in accordance with the following claims and their equivalents.

The following Detailed Description of the embodiments will so fully reveal the general nature of the present disclosure that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

Those skilled in the relevant art(s) will recognize that this description may be applicable to many various semiconductor devices, and should not be limited to any particular type of semiconductor devices. Before describing the various embodiments in more detail, further explanation shall be given regarding certain terms that may be used throughout the descriptions.

II. Terminology

The terms metal line, trace, wire, interconnect, conductor, signal path and signaling medium are all related. The related terms listed above, are generally interchangeable, and appear in order from specific to general. In this field, metal lines are sometimes referred to as traces, wires, lines, interconnect or simply metal. Metal lines, such as, but not limited to, aluminum (Al), copper (Cu), an alloy of Al and Cu, an alloy of Al, Cu and silicon (Si), tungsten (W), nickel (Ni), titanium nitride (TiN), and tantalum nitride (TaN) are conductors that provide signal paths for interconnecting electrical circuitry. Other conductors, both metal and non-metal are available in microelectronic devices. Materials such as doped polysilicon, doped single-crystal silicon (often referred to simply as diffusion, regardless of whether such doping is achieved by thermal diffusion or ion implantation), titanium (Ti), cobalt (Co), molybdenum (Mo), and refractory metal silicides are examples of other conductors.

FET, as used herein, refers to a metal-oxide-semiconductor field effect transistor (MOSFET). An n-channel FET is referred to herein as an NFET. A p-channel FET is referred to herein as a PFET. FETs that are formed in a bulk substrate, such as a silicon wafer, have four terminals, namely gate, drain, source and body.

Substrate, as used herein, refers to the physical object that is the basic workpiece transformed by various process operations into the desired microelectronic configuration. A typical substrate used for the manufacture of integrated circuits is a wafer. Wafers, may be made of semiconducting (e.g., bulk silicon), non-semiconducting (e.g., glass), or combinations of semiconducting and non-semiconducting materials (e.g., silicon-on-insulator (SOI)). In the semiconductor industry, a bulk silicon wafer is a very commonly used substrate for the manufacture of integrated circuits and MEMS.

The term vertical, as used herein, means substantially perpendicular to the surface of a substrate.

The term "etch" or "etching" or "etch-back" generally describes a fabrication process of patterning a material, such that at least a portion of the material remains after the etch is completed. For example, generally the process of etching a semiconductor material involves the steps of patterning a masking layer (e.g., photoresist or a hard mask) over the semiconductor material, subsequently removing areas of the semiconductor material that are no longer protected by the mask layer, and optionally removing remaining portions of the mask layer. Generally, the removing step is conducted using an "etchant" that has a "selectivity" that is higher to the semiconductor material than to the mask layer. As such, the areas of semiconductor material protected by the mask would remain after the etch process is complete. However, the above is provided for purposes of illustration, and is not limiting. In another example, etching may also refer to a process that does not use a mask, but still leaves behind at least a portion of the material after the etch process is complete.

The terms "deposit" or "dispose" describe the act of applying a layer of material to the substrate. Such terms are meant to describe any possible layer-forming technique including, but not limited to, thermal growth, sputtering, evaporation, chemical vapor deposition, epitaxial growth, atomic layer deposition, electroplating, etc.

In an embodiment, devices fabricated in and/or on the substrate may be in several regions of the substrate, and these regions may not be mutually exclusive. That is, in some embodiments, portions of one or more regions may overlap.

III. An Example Electronic System

FIG. 1A illustrates an electronic system 100, according to an embodiment. Electronic system 100 includes a printed wiring board (PWB) 101 and an electronic component 102. Electronic system 100 as shown in FIG. 1A includes only one PWB 101 and one electronic component 102 for the sake of simplicity. However, as would be understood by a person skilled in the art based on the description herein, electronic system 100 may include any number of PWBs and any number of electronic components. Electronic component 102 may be electrically coupled to PWB 101, and in embodiments where there are more than one electronic components, PWB 101 may further include a set of interconnects to electrically couple one component to another.

A. An Example Electronic Component

Figure 1B:
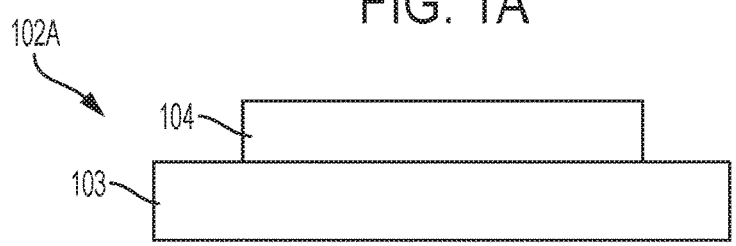
FIG. 1B illustrates an electronic component, according to an embodiment.

FIG. 1B illustrates an electronic component 102A, according to an embodiment. Electronic component 102A includes a microchip 104 and may further include a package substrate 103. Electronic component 102A as shown in FIG. 1B includes only one package substrate 103 and one microchip 104. However, as would be understood by a person skilled in the art based on the description herein, electronic component 102A may include any number of package substrates and any number of microchips. Although microchip 104 is shown in FIG. 1B to be disposed over package substrate 103, in alternative embodiments, microchip 104 may be entirely in or partially in package substrate 103.

Still referring to FIG. 1B, package substrate 103 may be, but not limited to, a land-grid array (LGA) package with a laminate substrate, an FR4 substrate, ceramic, silicon, or glass substrate, and Microchip 104 may be, but not limited to, an integrated circuit (IC), a MEMS-only chip, or an integrated MEMS chip.

According to another embodiment, electronic component 102A may further include a second microchip disposed over, entirely in, or partially in package substrate 103. The second microchip may be, for example, an application-specific integrated circuits (ASIC). Microchip 104 may be electrically coupled to the second microchip using at least one interconnect structure. The interconnect structure may be, for example, a wire bond with a first end interfacing with microchip 104 and a second end interfacing with the second microchip. Alternatively, microchip 104 may be electrically coupled to the second microchip through the package substrate 103, according to an embodiment. For example, microchip 104 may be electrically coupled to package substrate 103 using a first array of solder balls, and package substrate 103 may be electrically coupled to the second microchip using a second array of solder balls.

B. Example Microchips

Figure 1C:
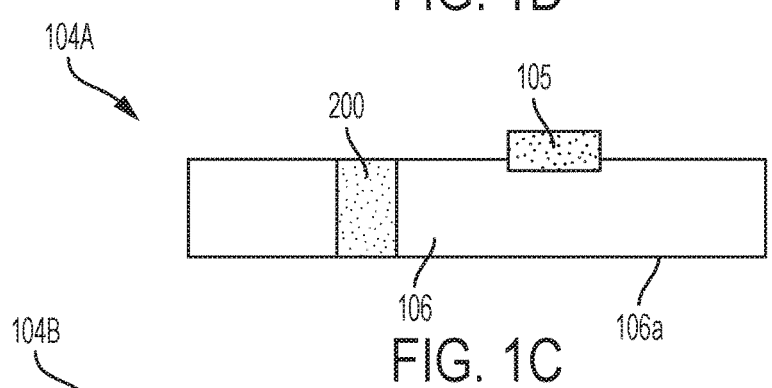
FIG. 1C illustrates a microchip, according to an embodiment.

FIG. 1C illustrates a microchip 104A, according to an embodiment. Microchip 104A includes a substrate 106 having a backside 106a and a through-substrate via (TSV) 200, and microchip 104A may further include a micro-fabricated device 105. TSV 200 includes an electrically conductive structure and an insulating structure. The insulating structure electrically insulates substrate 106 from the conductive structure. Furthermore, TSV 200 may be electrically coupled to micro-fabricated device 105, and TSV 200 may also be electrically coupled to package substrate 103 of FIG. 1B or to devices that may be present on backside 106a of microchip 104A.

Still referring to FIG. 1C, micro-fabricated device 105 may be formed entirely in the substrate, entirely over the substrate, or partially in the substrate. Micro-fabricated device 105 may be, but not limited to, a field-effect transistor (FET) or a micro-electro-mechanical systems (MEMS) device. A MEMS device may be, but not limited to, a MEMS accelerometer or a MEMS gyroscope.

Figure 1D:
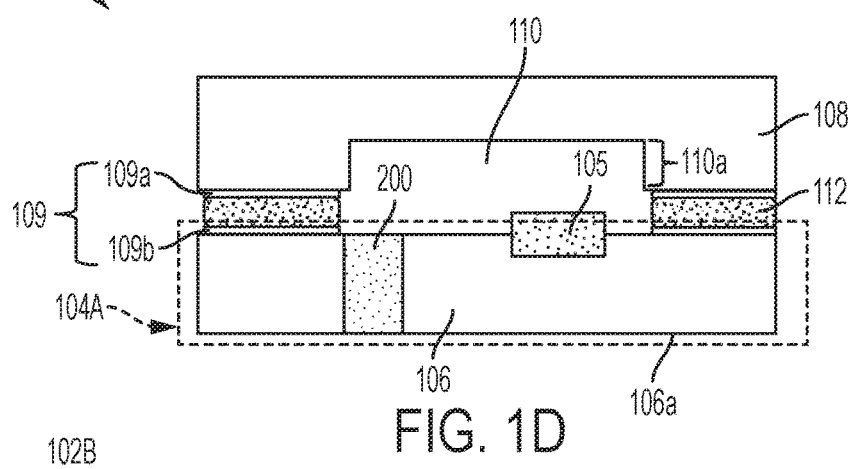
FIG. 1D illustrates a microchip, according to another embodiment

FIG. 1D illustrates a microchip 104B, according to another embodiment. Microchip 104B includes microchip 104A of FIG. 1C and further includes a cap 108. Cap 108 may provide hermetic sealing, according to an embodiment. Cap 108 may also include a recess 110 having a depth 110a. Such recess prevents cap 108 from contacting micro-fabricated device 105. In an example where micro-fabricated device 105 is a MEMS device, which may have moving parts, depth 110a may be increased to provide additional operating space.

Still referring to FIG. 1D, the presence of cap 108 may prevent physical access to micro-fabricated device 105 from the top. However, by electrically coupling micro-fabricated device 105 to TSV 200, micro-fabricated device 105 may be electrically coupled to through TSV 200 from the backside 106a of microchip 104A.

Still referring to FIG. 1D, microchip 104B may further include a bonding structure 112, which is used to bond cap 108 to microchip 104A. Microchip 104B may also include a first adhesion layer 109a and a second adhesion layer 109b. In such instances, first adhesion layer 109a may be disposed between bonding structure 112 and cap 108, and second adhesion layer 110 may be disposed between bonding structure 112 and microchip 104A. The presence of adhesion layers 109a and 109b may improve adhesion strength between cap 108 and microchip 104A.

In an example, bonding structure 112 may be glass frit, and first adhesion layer 109a and second adhesion layer 109b may be a metal layer such as, but not limited to, aluminum. Alternatively, bonding structure 112 may be made of aluminum-germanium eutectic, and first and second adhesion layers 109a and 109b may be made of titanium nitride. According to another embodiment, first and second adhesion layers 109a and 109b may each include a plurality of layers.

According to an embodiment, microchip 104B may be oriented relative to a package substrate (e.g., package substrate 103 of FIG. 1B) such that cap 108 is positioned between microchip 104A and the package substrate. Moreover, TSV 200 may be electrically coupled to the package substrate or to another chip on the same package substrate (e.g., the second microchip of electronic component 102A) using, for example, wire bonds. Alternatively, microchip 104B may be oriented relative to a package substrate such that microchip 104A is positioned between cap 108 and the package substrate, and TSV 200 may be electrically coupled to the package substrate using, for example, an array of solder balls.

C. An Example Electronic Component

Figure 1E:
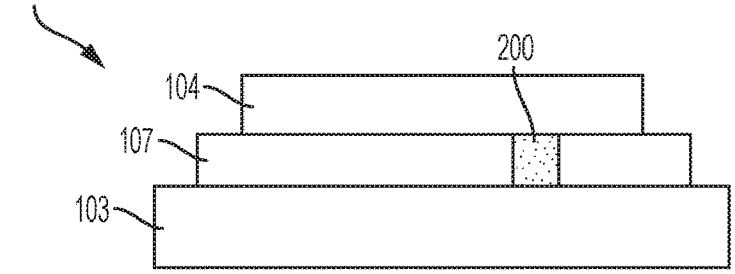
FIG. 1E illustrates an electronic component, according to another embodiment.

FIG. 1E illustrates an electronic component 102B, according to another embodiment. Electronic component 102B includes electronic component 102A of FIG. 1B and further includes an interposer 107. Interposer 107 includes a TSV 200 and may be disposed between package substrate 103 and microchip 104. Package substrate 103 and microchip 104 may be electrically coupled through TSV 200 of interposer 107. Interposer 107 may be made of, but not limited to, silicon or glass.

IV. An Example TSV

Figure 2A:
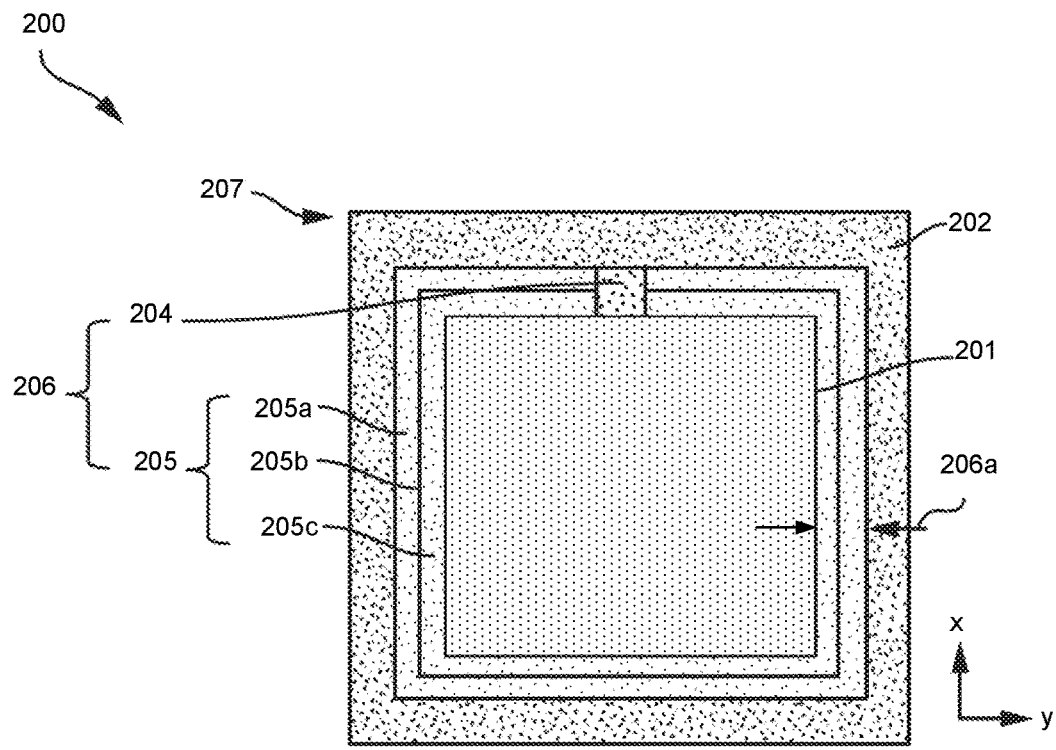
FIG. 2A illustrates a top view of a TSV formed in a substrate, according to an embodiment.

FIG. 2A illustrates a top view of a TSV 200 formed in substrate 207, according to an embodiment. TSV 200 includes a via 201, a bulk region 202, and an isolating structure 206 having a first width 206a. Isolating structure 206 includes a solid portion 204 and a seam portion 205. Seam portion 205 includes an outer insulator 205a, a seam 205b, and an inner insulator 205c, where seam 205b is positioned between outer insulator 205a and inner insulator 205c. Seam portion 205 and solid portion 204 collectively form a closed loop surrounding via 201.

Solid portion 204, outer insulator 205a, and inner insulator 205c may be made of one or more insulating dielectric material, for example, silicon dioxide. Via 201 may be made of a conductor or a semiconductor material, for example, silicon or doped silicon.

Figure 2B:
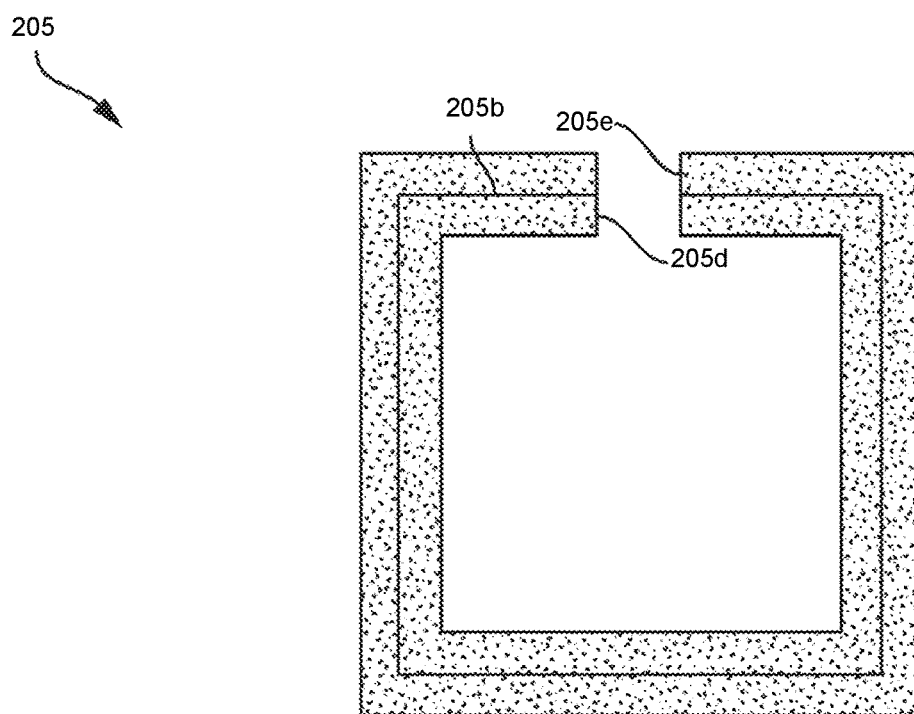
FIG. 2B illustrates an isolated top view of a seam portion, according to an embodiment.

FIG. 2B illustrates an isolated view of seam portion 205 of FIG. 2A. Seam portion 205 has a first end 205d and a second end 205e, and both ends are in contact with seam 205b.

Figure 2C:
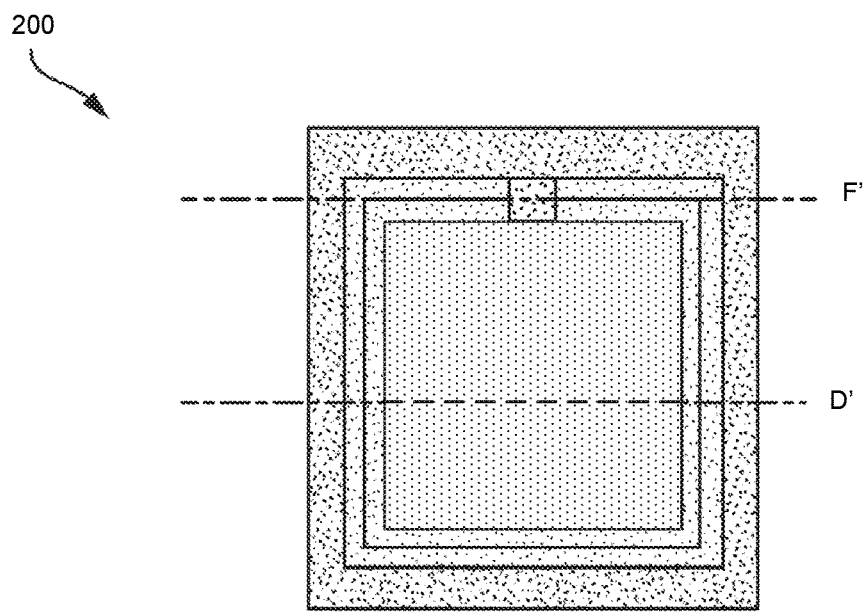
FIG. 2C illustrates the TSV of FIG. 2A with a different set of labels.
Figures 2D, 2E:
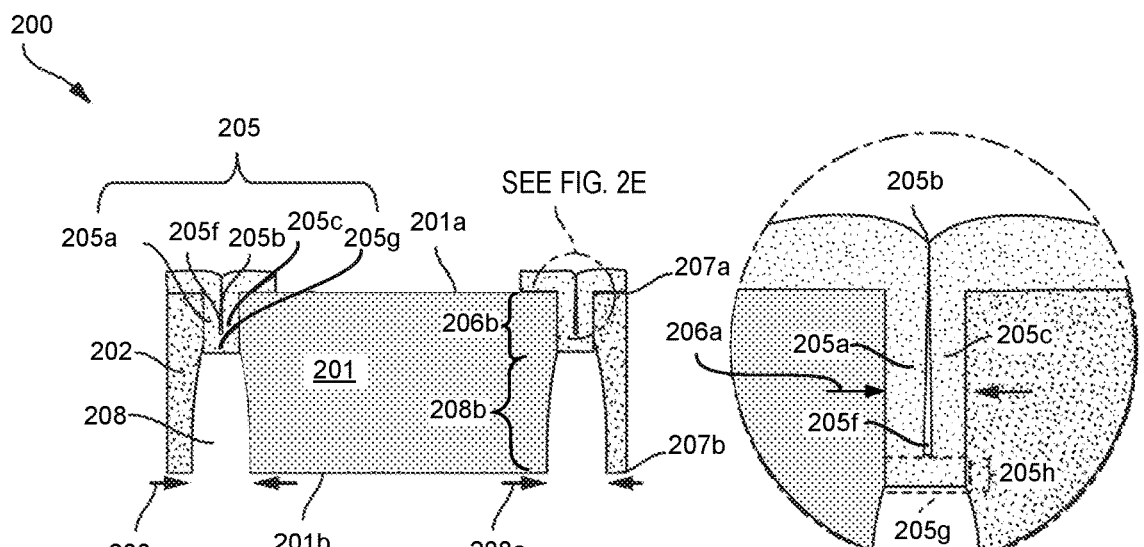
FIG. 2D illustrates a cross-sectional view of the TSV in FIG. 2A taken along line D', according to an embodiment.
FIG. 2E illustrates a cross-sectional view of the insulating structure in FIG. 2D, according to an embodiment.

FIG. 2C illustrates a top view of TSV 200 as shown in FIG. 2A. FIGS. 2D-2E illustrate cross-sectional views of TSV 200 taken along lines D' and F', respectively.

FIGS. 2D and 2E illustrate cross-sectional views of TSV 200 taken along line D' of FIG. 2C. TSV 200 further includes an insulating region 208 having a width 208a and a depth 208b. Seam portion 205 of insulating structure has a depth 206b. Via 201 has a first surface 201a and a second surface 201b, and substrate 207 has a first surface 207a and a second surface 207b. Seam portion 205 further includes a bottom insulator 205g having a thickness 205h. In another embodiment, seam portion 205 may further include a void 205f. Insulating region 208 extends through a second surface 207b of substrate 207 into substrate 207 to contact bottom insulator 205g of seam portion 205. In another embodiment, insulating region 208 may extend beyond bottom insulator 205g of seam portion 205 such that a bottom insulator 205g extrudes into insulating region 208.

Still referring to FIGS. 2D and 2E, width 208a of insulating region 208 is shown to be greater than width 206a of insulating structure 206, and depth 208b of insulating region 208 is shown to be greater than depth 206b of insulating structure 206. However, in alternative embodiments, depth 208b of insulating region 208 may be equal or less than depth 206b of insulating structure 206 and width 208a of insulating region 208 may be equal or less than width 206a of insulating structure 206.

Void 205f is positioned between seam 205b and bottom insulator 205g and is defined as the volume enclosed by outer insulator 205a, inner insulator 205c, and bottom insulator 205g. Seam 205b is an interface between outer insulator 205a and inner insulator 205c that is not mechanically fused, but merely in contact. Bottom insulator 205g of seam portion 205 is mechanically fused to both outer insulator 205a and inner insulator 205c.

Insulating region 208 may be made of a gaseous material such as, but not limited to, air, nitrogen, argon, or oxygen. Bottom insulator 205g may be made of one or more insulating dielectric material, for example, silicon dioxide, and solid portion 204, outer insulator 205a, inner insulator 205c, and bottom insulator 205g may all be made of the same insulating dielectric material. In another embodiment, solid portion 204, outer insulator 205a, inner insulator 205c, and bottom insulator 205g may each be made of a plurality of materials where at least one material is an insulating dielectric material.

Figure 2F:
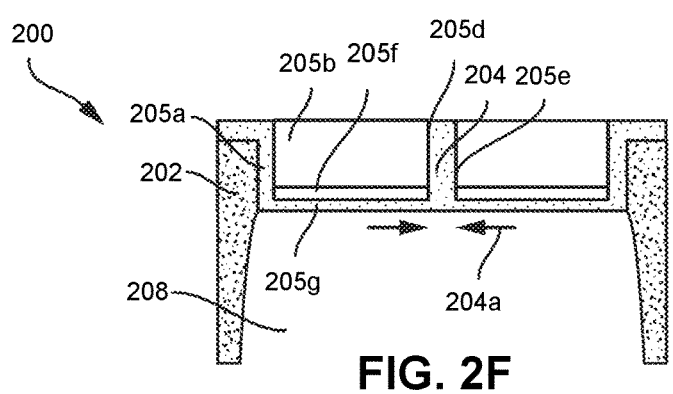
FIG. 2F illustrates a cross-sectional view of the TSV in FIG. 2A taken along line E', according to an embodiment.

FIG. 2F illustrates a cross-sectional view of TSV 200 taken along line F' of FIG. 2C. The figure illustrates, as noted above, that seam 205b is an interface between outer insulator 205a and inner insulator 205c that is not mechanically fused, but merely in contact, and void 205f is defined as the volume enclosed by outer insulator 205a, inner insulator 205c, and bottom insulator 205g.

Therefore, despite via 201 and bulk region 202 being held together by the entire insulating structure 206, it is only bottom insulator 205g and solid portion 204 of insulating structure 206 that mechanically connects via 201 to bulk region 202. As a result, mechanical reliability may be improved by increasing thickness 205h of bottom insulator 205g, by increasing width 204a of solid portion 204, or by increasing the number of solid portions.

V. Example Insulating Structures

Figure 3A:
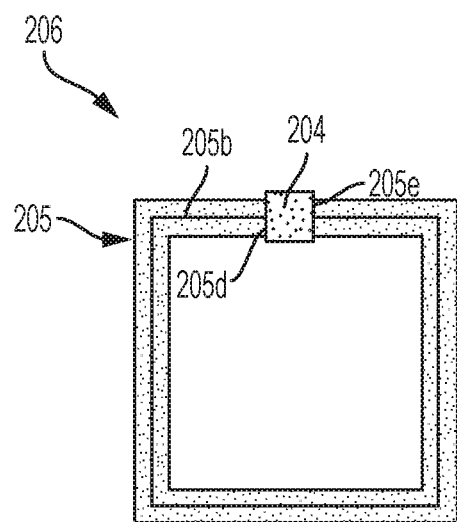
FIG. 3A illustrates an isolated view of the insulating structure in FIGS. 2A-2E.

FIG. 3A illustrates an isolated view of insulating structure 206 of FIGS. 2A-2E, which includes seam portion 205 separated by a single solid portion 204. As noted above, seam portion 205 has a first end 205d and a second end 205e, and first end 205d and second end 205e are both in contact with seam 205b. Solid portion 204 forms a closed loop with seam portion 205 and is in contact with first end 205d and second end 205e of seam portion 205. Insulating structure 206 may have a square shape. In another embodiment, insulating structure 206 may have a rectangular, a circular, or an ellipse shape.

Figure 3C:
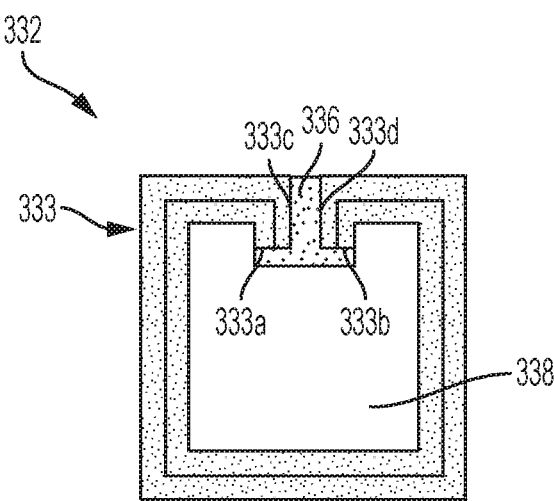
FIG. 3C illustrates an isolated view of an insulating structure, according to another embodiment.
Figure 3B:
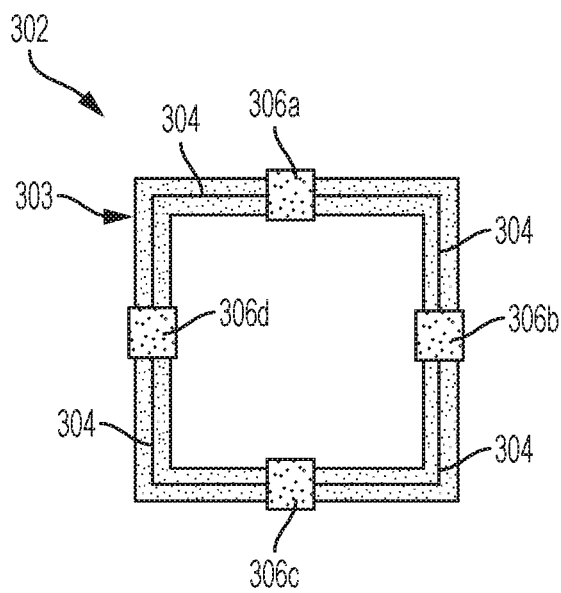
FIG. 3B illustrates an isolated view of an insulating structure, according to another embodiment.

FIG. 3B illustrates insulating structure 302, according to another embodiment. Insulating structure 302 is similar to insulating structure 206 as described above. Therefore, only differences between insulating structures 302 and 206 are described herein. Insulating structure 302 includes a seam portion 303 and four solid portions 306a-d. Seam portion 303 is separated into four segments 304 by four solid portions 306a-d, and seam portion 303 and four solid portions 306a-d collectively form a closed loop.

As noted above, mechanical reliability may be improved by increasing the number of solid portions. Thus, insulating structure 302 may have improved mechanical reliability compared to insulating structure 206.

FIG. 3C illustrates insulating structure 332, according to another embodiment. Insulating structure 332 is similar to insulating structure 206 as described above. Therefore, only differences between insulating structures 332 and 206 are described herein. Insulating structure 332 includes an inner region 338, a solid portion 336, and a seam portion 333 having a first end 333a, a second end 333b, a first side 333c, and a second side 333d. Solid portion 336 and seam portion 332 collectively form a closed loop surrounding inner region 338. First end 333a and second end 333b are curved inward toward inner region 338. In an alternative embodiment, first and second ends 333a and 333b may be curved away from inner region 338. Solid portion 336 is in contact with first and second ends 333a and 333b of seam portion 333. First and second sides 333c and 333d may be substantially parallel to each other.

Curved ends 333a and 333b of seam portions 333 may provide an advantage over straight ends 205d and 205e of seam portion 205 during the fabrication of insulating structures. For example, due to optical proximity correction (OPC) techniques used by modern photolithographic processes, two ends 205d and 205e may be difficult to pattern accurately and may be different from the intended design. In such instances, solid portion 204 may be difficult to form. However, curved ends 333c and 333d may resolve this issue because the two sides 333c and 333d of seam portion 333 can be patterned more accurately compared to ends 333a and 333b.

Figure 3D:
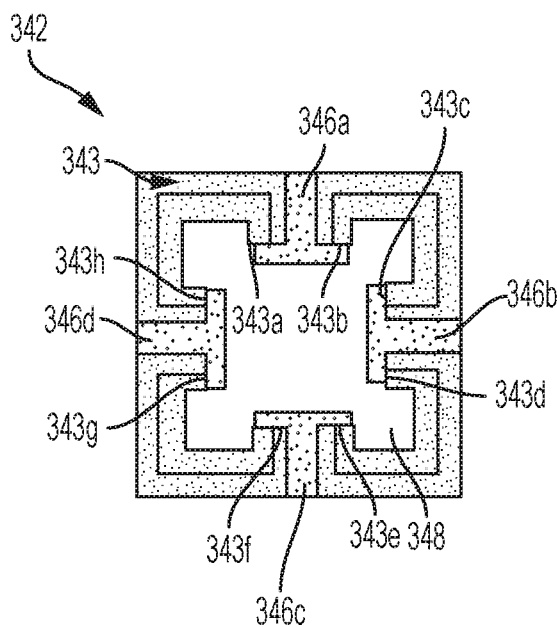
FIG. 3D illustrates an isolated view of an insulating structure, according to another embodiment.

FIG. 3D illustrates insulating structure 342, according to another embodiment. Insulating structure 342 is similar to insulating structure 332 as described above. Therefore, only differences between insulating structures 342 and 332 are described herein. Insulating structure 342 includes a seam portion 343 and four solid portions 346a-d, and seam portion 343 is separated into four parts by four solid portions 346a-d. Thus, seam portion 343 has eight ends 346a-h. Each end is curved inward toward inner region 348. In an alternative embodiment, each end may be curved away from inner region 348. Solid portions 346a-d are in contact with their respective two ends of seam portion 343. Solid portion 346 and four seam portions 342a-d collectively form a closed loop surrounding inner region 348.

Insulating structures 206, 302, 332, and 342 of FIGS. 3A-3D include one or four solid portions as illustrative examples. However, as would be understood by a person of skilled in the art based on the description herein, an insulating structure may have any number of solid portions.

VI. Example TSVs

Figure 4:
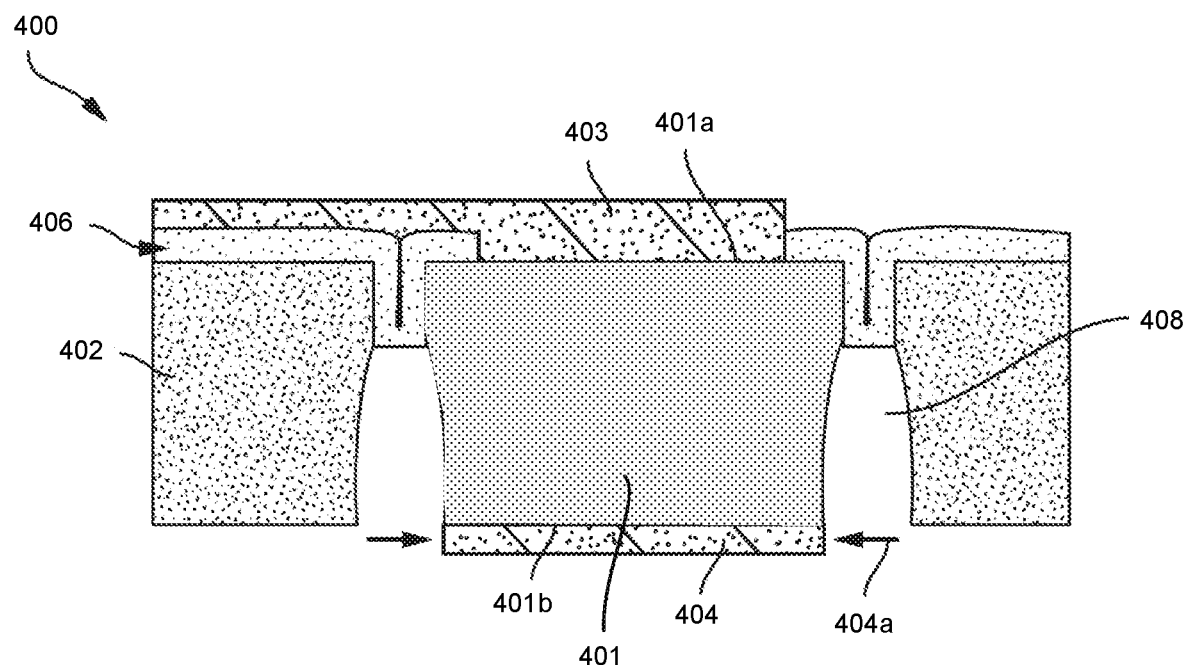
FIG. 4 illustrates a cross-sectional view of a TSV, according to another embodiment.

FIG. 4 illustrates a cross-sectional view of TSV 400, according to another embodiment. TSV 400 is similar to TSV 200 as described above. Therefore, only differences between TSV 200 and 400 are described herein. TSV 400 includes a via 401 having a first surface 401a and a second surface 401b, a bulk region 402, a first wire 403, a via pad 404 having a width 404a, an insulating structure 406, and an insulating region 408.

Insulating structure 406 may extend over bulk region 402 to electrically insulate first wire 403 from bulk region 402. First wire 403 is electrically coupled to via 401 through first surface 401a. Via pad 404 is disposed over second surface 401b and may cover entire second surface 401b. Alternatively, via pad 404 may cover a portion of second surface 401b. In an example where insulating region 408 is made of a gaseous material, via pad 404 may not extend beyond second surface 401b.

First wire 403 may be made of a conductive material. For example, first wire 403 may be made of metal such as, but not limited to, copper or aluminum. Via pad 404 may be made of a conductive material. For example, via pad may be made of metal such as, but not limited to copper or aluminum. In another embodiment, via pad 404 may be made of a plurality of materials. For example, via pad 404 may be a multi-layer under-bump metallization (UBM).

Figure 5:
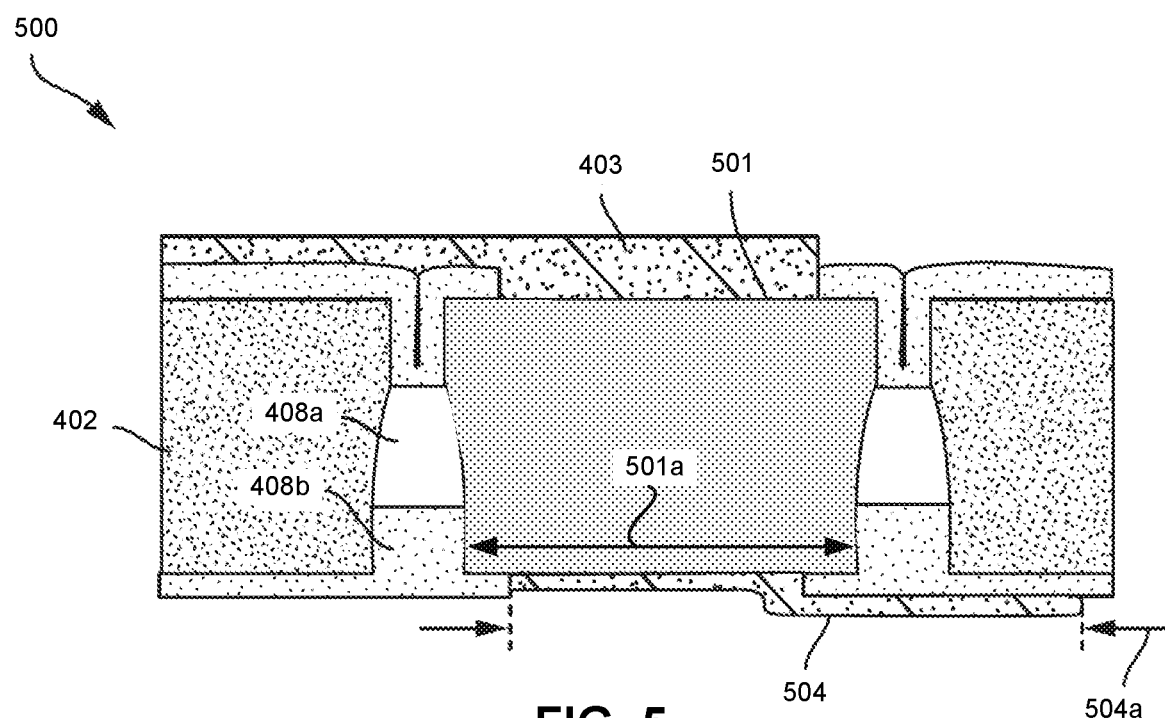
FIG. 5 illustrates a cross-sectional view of a TSV, according to another embodiment.

FIG. 5 illustrates a cross-sectional view of TSV 500, according to another embodiment. TSV 500 is similar to TSV 400 as described above. Therefore, only differences between TSV 500 and 400 are described herein. TSV 500 includes a via 501 having a width 501a, a via pad 504 having a width 504a, and insulating region 408 having an upper portion 408a and a lower portion 408b. Lower portion 408b may be made of a solid insulating material, and upper portion 408a may be made of a gaseous material.

Lower portion 408b may extend over bulk region 402. According to an embodiment, lower portion 408b may be disposed over a portion of via 501. Via pad 504 is disposed over portions of bulk region 402, insulating region 408, and via 501. Width 504a of via pad 504 may be larger than width 501a of via 501. Via pad 504 is electrically coupled to via 501 and electrically insulated from bulk region 402 by lower portion 408b.

Some packaging technologies have requirements on dimensions of pads. And, since TSV 400 of FIG. 4 may not have width 401a of via 401 that is smaller than width 404a of via pad 404, the packaging requirements may imposes a minimum width for via 401. On the other hand, TSV 500 of FIG. 5 may have width 504a of via pad 504 that is larger than width 501a of via 501, as noted above. Thus, size of TSV 500 may be reduced without being limited by packaging requirements.

VII. Example Microchips

Figure 6A:
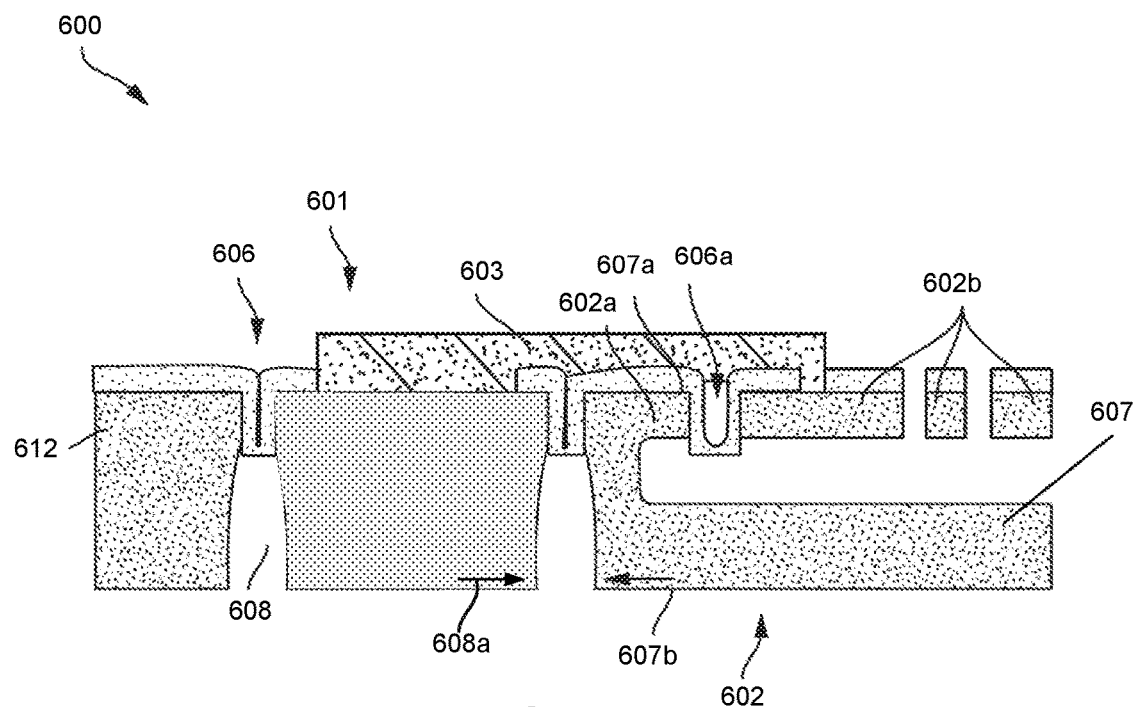
FIG. 6A illustrates a cross-sectional view of a microchip including a TSV and a MEMS device, according to an embodiment.

FIG. 6A illustrates a cross-sectional view of a microchip 600, according to an embodiment. Microchip 600 includes a wire 603, a TSV 601 and a MEMS device 602. TSV 601 is similar to TSV 500 as described above. Therefore, only differences between TSV 601 and 500 are described herein. Insulating structure 606 of TSV 601 further includes an isolation joint portion 606a, and MEMS device 602 includes a first portion 602a and a second portion 602b. In an example, MEMS device 602 requires that first portion 602a and second portion 602b are electrically insulated from each other. Isolation joint portion 606a of insulating structure 606 provide such electrical insulation.

Still referring to FIG. 6A, isolation joint portion 606a extends through first surface 607a of substrate 607 into substrate 607 and is positioned between first portion 602a and second portion 602b of MEMS device 602. Isolation joint portion 606a may be disposed over first portion 602a. Furthermore, isolation joint portion 606a may be formed at the same time as insulating structure 606 to reduce fabrication cost.

Still referring to FIG. 6A, wire 603 is electrically coupled to via 601 and to second portion 602b, but insulating structure 606 electrically insulates wire 603 from first portion 602a. According to another embodiment, wire 603 may be disposed over insulating structure 606, via 601, first portion 602a, or second portion 602b.

According to an embodiment, MEMS 602 may be formed after the formation of insulating structure 606 including isolation joint portion 606a but before the formation of insulating region 608. In some embodiments, MEMS 602 may be formed after the formation of wire 603 but before the formation of insulating region 608. An example of MEMS 602 may be a MEMS device disclosed by U.S. Pat. No. 8,664,731, which is hereby incorporated by reference in its entirety. According to an embodiment, microchip 600 may further include a cap, as illustrated in FIG. 1D. In such embodiments, microchip 600 may further include a bonding structure and adhesion layers to bond the cap to substrate 607.

Figure 6B:
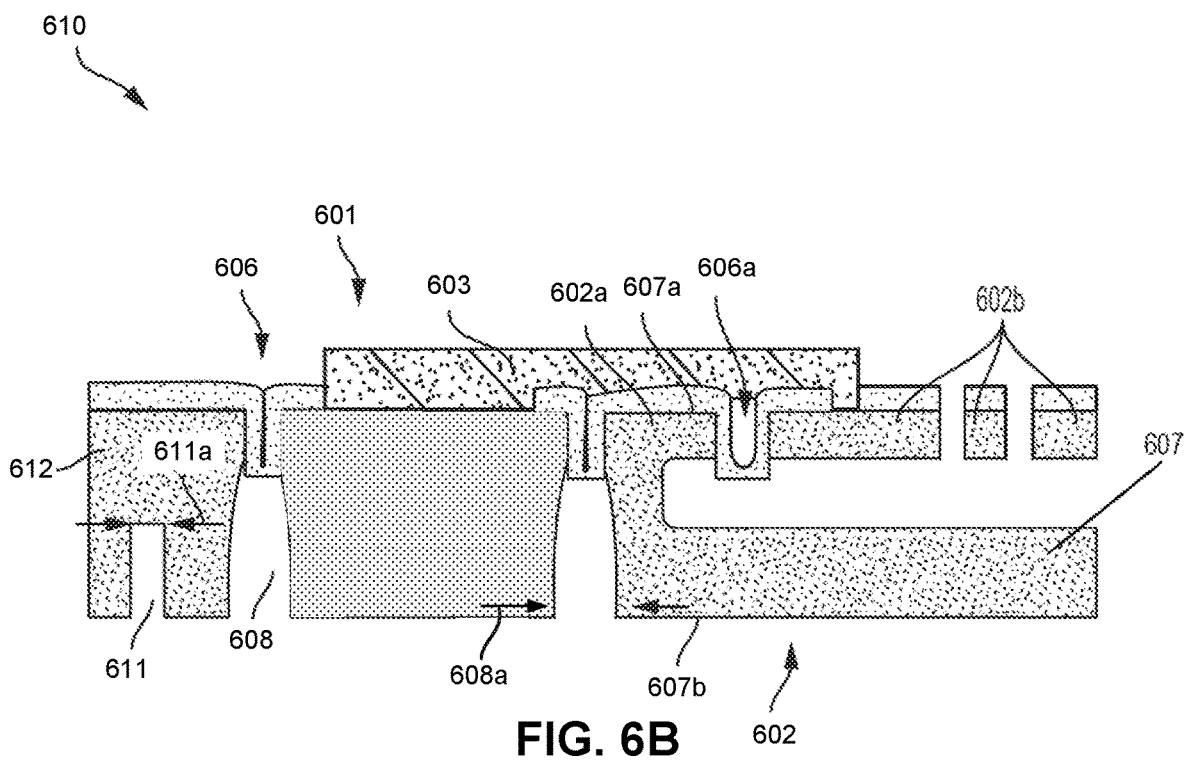
FIG. 6B illustrates a cross-sectional view of a microchip including a TSV and a MEMS device, according to another embodiment.

FIG. 6B illustrates a cross-sectional view of a microchip 610, according to an embodiment. Microchip 610 is similar to microchip 600 as described above except that microchip 610 further includes a side trench 611 having a width 611a. The presence of side trench 611 may reduce chipping of silicon region 612.

Width 611a of side trench 611 is smaller than width 608a of insulating region 608, and depth 611a may be less than the depth of insulating region 608 thereby leaving some silicon above side trench 611. In some embodiments, this may be due to etch lag effects that occur when side trench 601 and insulating region 608 are etched at the same time. The presence of silicon above side trench 611 may prevent cracks, formed during a substrate dicing process, from propagating into insulating region 608.

VIII. An Example Fabrication Process for TSV

Figure 7A:
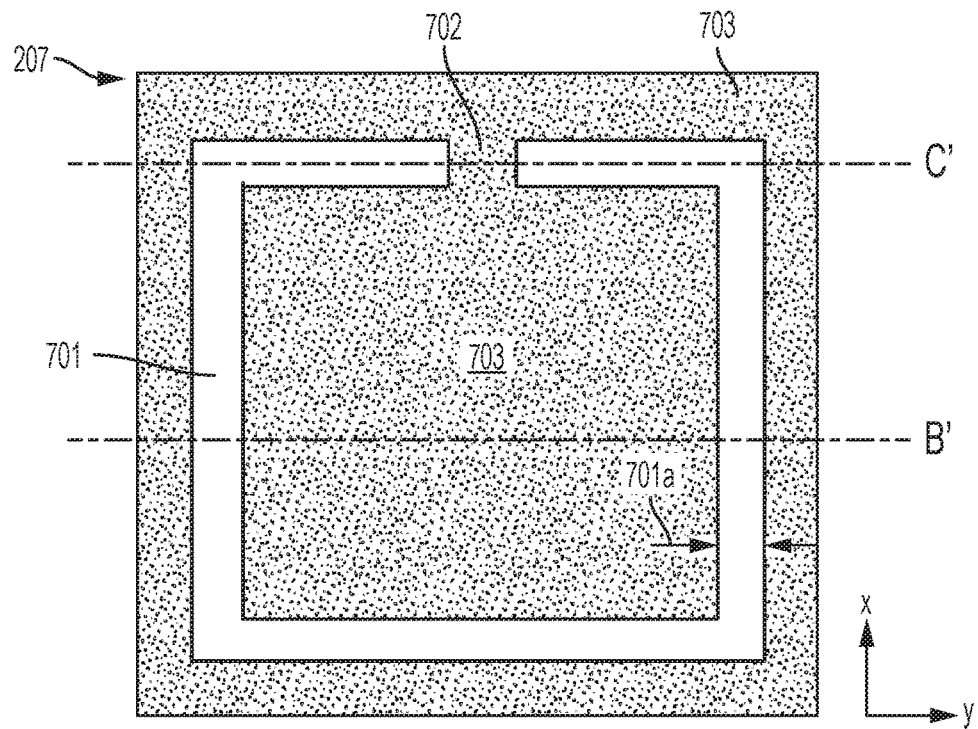
FIGS. 7A-7C illustrate a partially fabricated TSV after forming a trench, according to an embodiment.
Figure 7B:
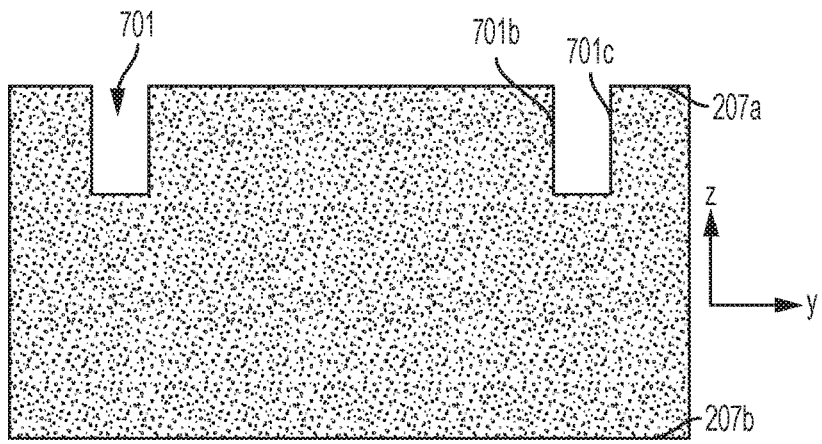
Figure 7C:
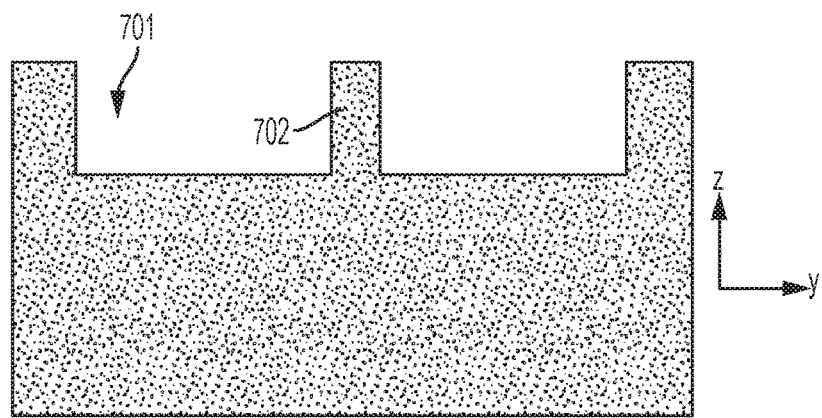

FIGS. 7A-7C illustrate a partially fabricated TSV 200 after formation of a trench 701 having a width 701a in substrate 207, according to an embodiment. Trench 701 and substrate portion 702 collectively form a closed loop surrounding inner region 703. FIG. 7A illustrates a top view, and FIGS. 7B and 7C illustrate cross-sectional views taken along lines B' and C' of FIG. 7A, respectively.

Trench 701 has a width 701a, an inner sidewall 701b, and an outer sidewall 701c. Trench 701 may be formed by any conventional etching methods suitable for etching the material of substrate 207. For example, a dry etch process such as, but not limited to, reactive ion etching (ME) or Bosch process may be performed to remove the material of substrate 207 for the formation of trench 301.

Figure 8A:
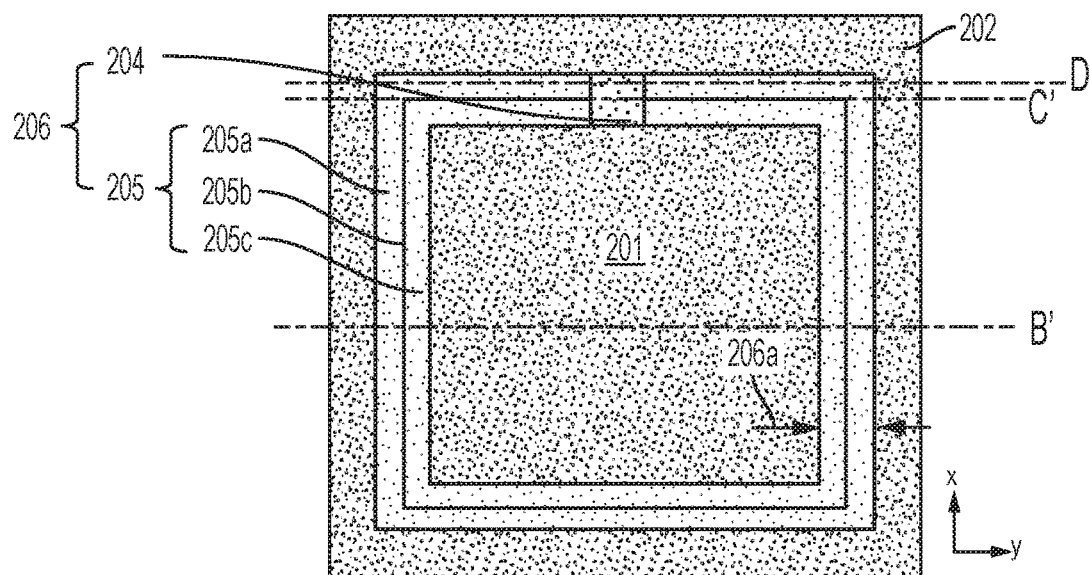
FIGS. 8A-8C illustrate a partially fabricated TSV after forming an insulating structure, according to an embodiment
Figure 8B:
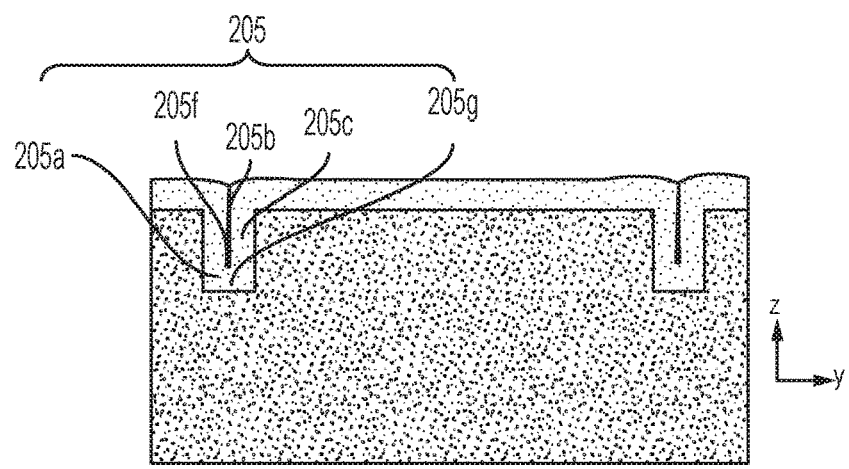
Figure 8C:
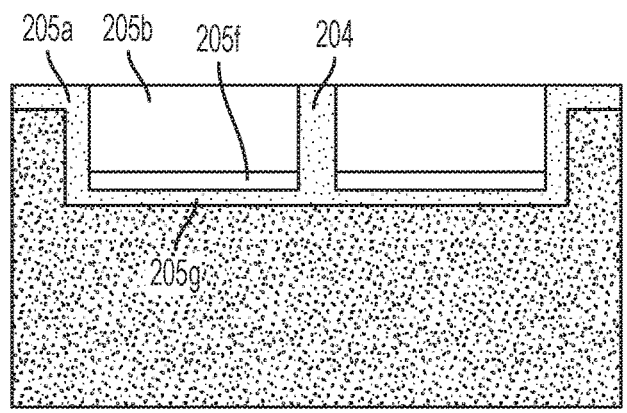

FIGS. 8A-8C illustrate a partially fabricated TSV 200 after forming insulating structure 206 by filling trench 701 to form seam portion 205 and by converting substrate portion 702 into a solid portion 204, according to an embodiment. FIG. 8A illustrates a top view, and FIGS. 8B and 8C illustrate cross-sectional views taken along lines B' and C' of FIG. 8A, respectively.

Trench 701 can be filled with an insulating dielectric material to form a seam portion 205. As noted above, the insulating dielectric material may be, for example, silicon dioxide or other suitable insulating dielectric materials. In an example where the insulating dielectric material is silicon dioxide, an oxidation process may be performed to fill trench 701. This oxidation process consumes silicon surfaces of the substrate to form silicon dioxide. The resulting volumetric expansion from this process causes the sidewalls 701b and 701c of trench 701 to encroach upon each other, eventually closing the trench. Since some of silicon is consumed, width 206a of insulating structure 206 may be greater than width 701a of trench 701. During this process, trench 701 may be incompletely filled, forming a seam 205b and a void 205f in seam portion 205, according to an embodiment. Although a void 205f is illustrated in FIG. 8B, alternative embodiments may not have any void in seam portion 205. During the same process or in a separate process, substrate portion 702 is also consumed completely and converted to a solid portion 204, for example, using the same oxidation process as described above for filling trench 701.

Figure 9A:
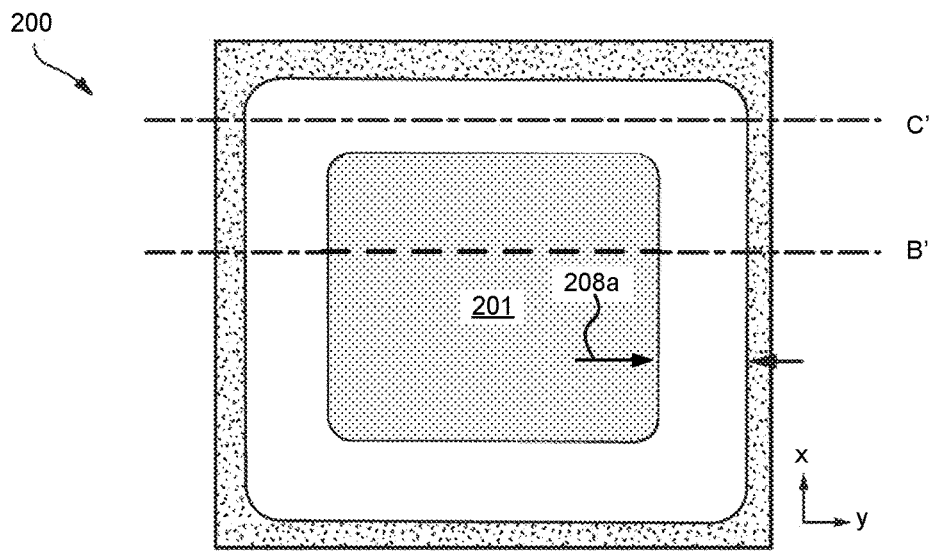
FIGS. 9A-9C illustrate TSV 200 after forming an insulating region, according to an embodiment.
Figure 9B:
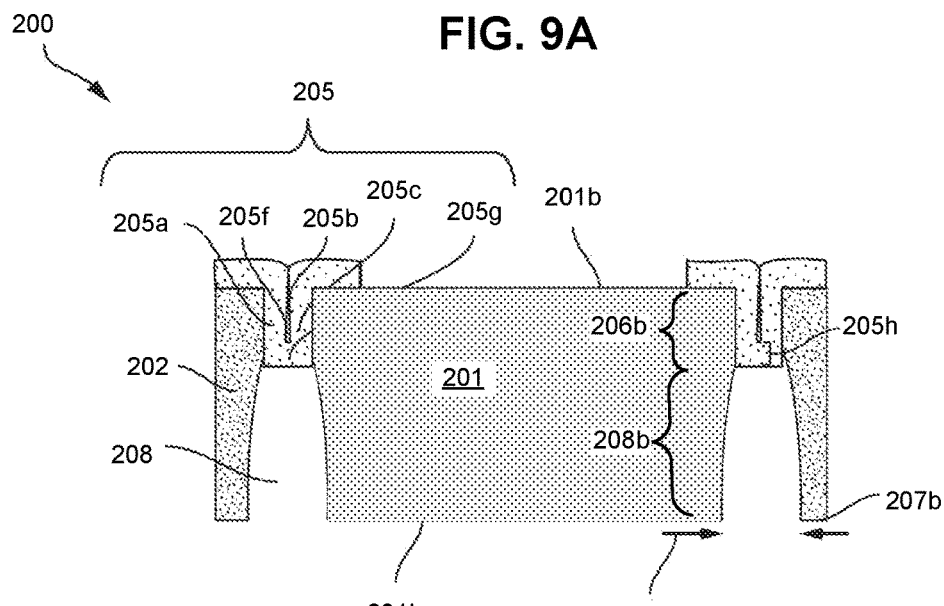
Figure 9C:
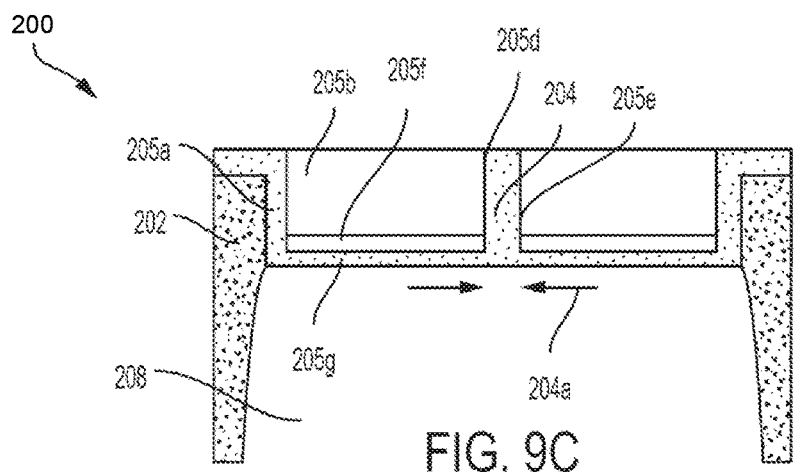

FIGS. 9A-9C illustrate TSV 200 after forming insulating region 208, according to an embodiment. FIG. 9A illustrates a bottom view, and FIGS. 9B and 9C illustrate cross-sectional views taken along lines B' and C' of FIG. 9A, respectively.

Insulating region 208, having a depth 208b, may be formed by any conventional etching methods suitable for etching the material of substrate 207. For example, a dry etch process such as, but not limited to, reactive ion etching (RIE) or Bosch process may be performed to remove the material of substrate 207 for the formation of insulating region 208.

In another embodiment, the etch process used to form insulating region 208 may not remove the material of bottom insulator 205g. Therefore, as noted above, insulating region 208 may extend beyond bottom insulator 205g of seam portion 205 such that bottom insulator 205g extrudes into insulating region 208.

In another embodiment, substrate 207 may be thinned by removing a portion of substrate 207 from second surface 207b. Thinning of substrate 207 may be performed by, for example, a physical grinding, a chemical etching, or a chemical mechanical planarization (CMP) process. This thinning process may be performed prior to formation of insulating region 208, in an embodiment. Since some etch processes limit the aspect-ratio of etched features, prior thinning of substrate 207 may enable insulating region 208 with a smaller depth 206b and width 208a. Thus, in some embodiments, depth 208b of insulating region 208 may be equal or less than depth 206b of insulating structure 206, and width 208a of insulating region 208 may be equal or less than width 206a of insulating structure 206.

Figure 10:
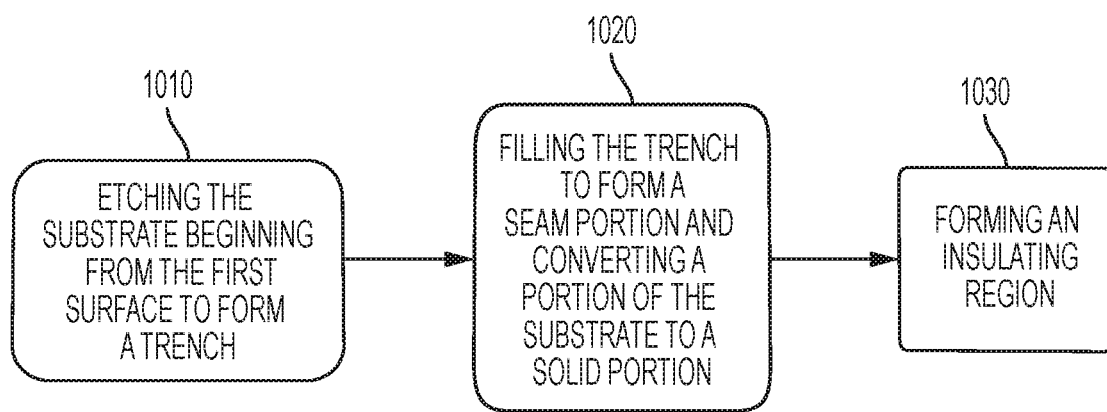
FIG. 10 is a flow chart illustrating a method of fabricating the TSV in FIGS. 2A-2E, according to an embodiment.

FIG. 10 is a flow chart illustrating a method of fabricating TSV 200 shown in FIGS. 2A-2E, according to an embodiment. Solely for illustrative purposes, the steps illustrated in FIG. 10 will be described with reference to example fabrication process illustrated in FIGS. 7A-7C, 8A-8C, and 9A-9C.

In step 1010, trench 701 is formed in first surface 207a of substrate 207, as shown in FIGS. 7A-7C, by an etch process. The etch process may be, but not limited to, reactive ion etching (ME) to remove the material of substrate 207, according to an embodiment.

In step 1020, trench 701 is filled to form a seam portion 205 and to convert substrate portion 702 to solid portion 204, as shown in FIGS. 8A-8C. Filling of trench 701 may be performed by, for example, growing a thermal oxide such as silicon dioxide directly from substrate 207 using thermal oxidation. Converting of substrate portion 702 to solid portion 204 may be performed by, for example, growing a thermal oxide such as silicon dioxide directly from substrate 207 using thermal oxidation. The thermal oxidation process completely consumes the substrate portion 702 to form silicon dioxide.

In step 1030, insulating region 208 is formed surface 207b of substrate 207, as shown in FIGS. 9A-9C, by an etch process. The etch process may be, but not limited to, reactive ion etching (ME) to remove the material of substrate 207, according to an embodiment.

IX. An Example Fabrication Process for TSV and MEMS

Another example fabrication process for forming both a TSV and a MEMS device is described.

Figure 11A:
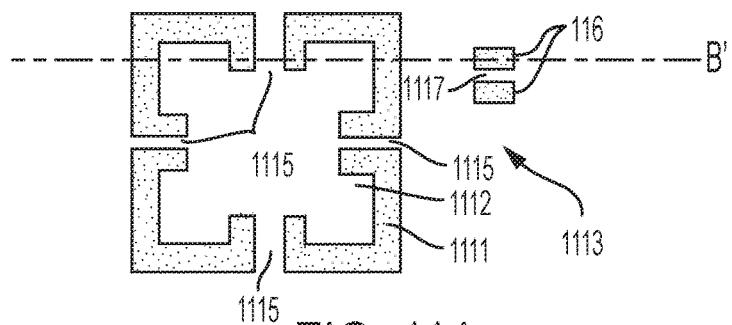
FIGS. 11A-11H illustrate a fabrication process for forming a TSV and a MEMS device in a substrate, according to an embodiment.

The process starts with the wafer pattern as shown in FIG. 11A. FIG. 11A shows an example TSV trench opening pattern with segmented trenches 1111 that mostly surrounds silicon 1112. Eventually, the process separates silicon 1112 from surrounding silicon 1113.

FIG. 11A also illustrates an opening for a short isolation segment pair 1116. Typical dimensions are on the order of 4 µm long, 1.2 µm wide, and separated by 1 µm. Isolation segment pair 1116 is intended to eventually isolate a freestanding MEMS structure from surrounding silicon 1113. Cross sectional views taken along line B' are illustrated in FIGS. 11B-11G to detail the fabrication process. As noted above, the narrow silicon spaces, generally indicated by 1115 and 1117, eventually form bridge portions that enhance the structural strength of the insulating structure and the isolation joint.

Figure 11B:
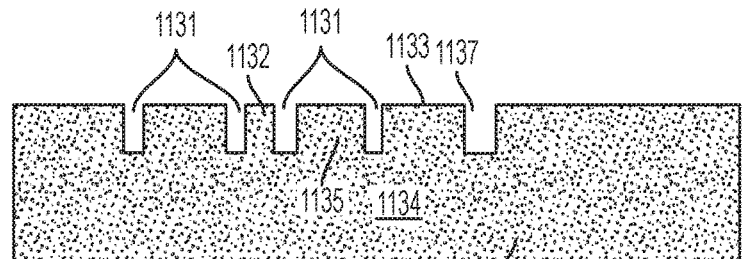

When pattern 1111 of FIG. 11A is transferred into the silicon using a Bosch silicon etch, trenches 1131 and 1137 are formed, as shown in FIG. 11B. Mostly surrounded silicon 1112 of FIG. 11A is shown as silicon 1135 in FIG. 11B. Trench opening 1137 of FIG. 11B shows where one of the segmented isolation joints will be formed in order to isolate a freestanding MEMS structure.

Figure 11C:
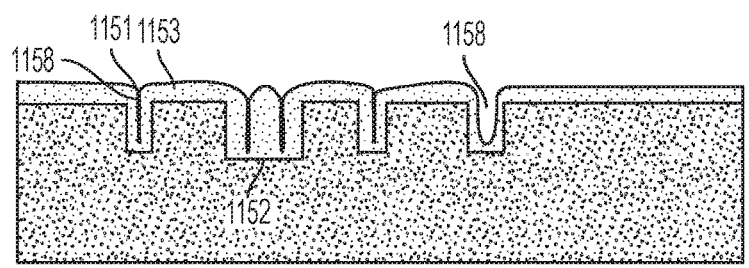

In a subsequent step, silicon dioxide is grown until trenches 1131 of FIG. 11B close off due to the two oxidation fronts merging from each pair of adjacent trench walls, as shown in FIG. 11C. At this merger of oxidation fronts, a seam 1158 is formed. The seam 1158 may be weaker than the bulk silicon dioxide material. FIG. 11C shows the seam 1158 as being unfilled through the cross section because the two opposing oxidation fronts are not mechanically fused. After an oxidation process, narrow silicon portion 1132 of FIG. 11B fully oxidizes and forms a bridge portion 1152, as shown in FIG. 11C.

Figure 11D:
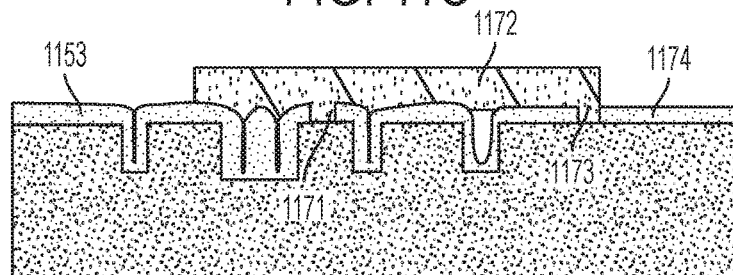

In a subsequent step, as illustrated in FIG. 11D, via openings 1171 and 1173 are opened in top oxide 1153. Metal trace 1172 connects to the TSV structure through via opening 1171. The eventual freestanding MEMS structure location is generally shown by location 1174.

Figure 11E:
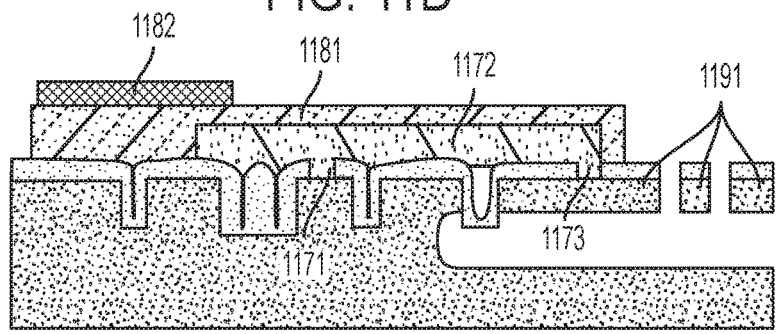

In a subsequent step, as illustrated in FIG. 11E, a second interlayer dielectric 1181 is deposited and patterned. Additionally, metal layer 1182 is also deposited and patterned in order to provide a bonding interface. A freestanding MEMS structure 1191 is created using a series of processing steps described in, for example, U.S. Pat. No. 8,319,254, the entirety of which is incorporated by reference herein.

Figure 11F:
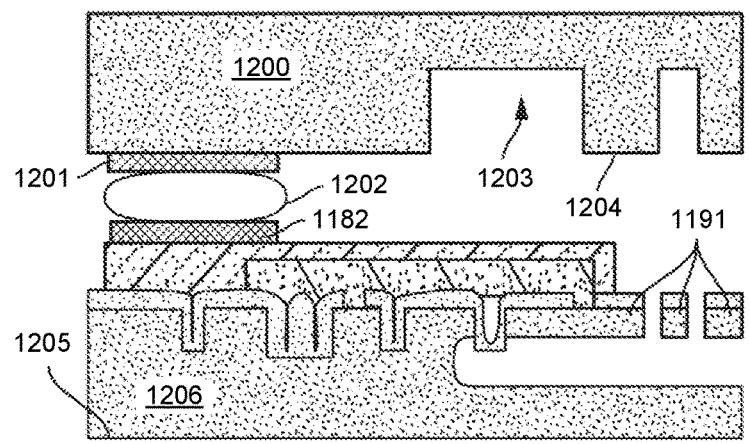

In a subsequent step, as illustrated in FIG. 11F, a lid 1200 is bonded to substrate 1206 using glass frit 1202. Metal layers 1201 and 1182 form interface layers to promote adhesion. Alternative materials such as aluminum-germanium eutectics could be used to bond lid 1200 to substrate 1206. Silicon recess 1203 is used to allow the freestanding MEMS structure 1191 to move through its necessary operational range before hitting silicon stop 1204.

Once bonded together, the substrate can be ground on surface 1205 for two reasons. First, the total MEMS stack thickness needs to be reduced to fit into the ever shrinking consumer electronics products. Second, by grinding surface 1205, the silicon thickness that needs to be etched to form an insulating region is reduced.

Figure 11G:
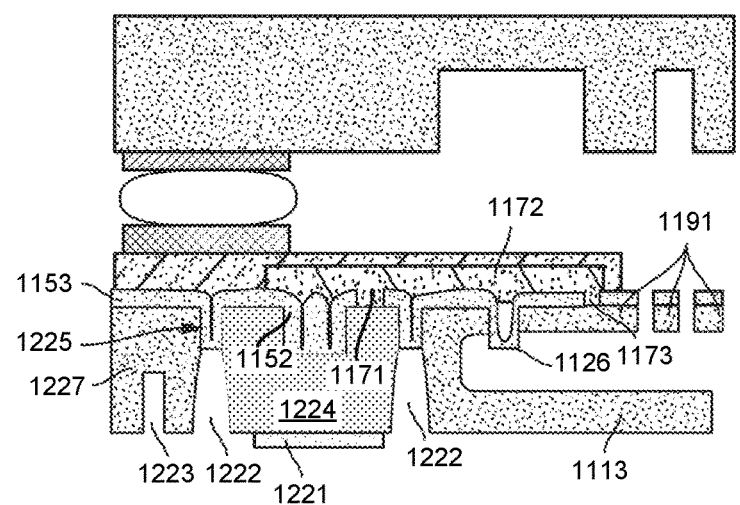

FIG. 11G illustrate a step to complete the TSV structure. First, metal bond pad 1221 is formed on the end of the TSV structure 1224. Second, isolation region 1222 is etched into the silicon until the bottoms of the isolation structure 1225 are exposed. At this point in the process, TSV 1224 is electrically isolated from the surrounding silicon 1113. And, TSV structure 1224 is strengthened by the segmentation of the insulating structure using solid portions 1152. TSV structure 1224 is electrically connected to freestanding MEMS 1191 through via opening 1171, metal trace 1172, and via opening 1173. Freestanding MEMS 1191 is isolated from surrounding silicon 1113 by the segmented isolation joint 1126.

In order to reduce chipping of the silicon adjacent to TSV structure 1224, trench 1223 is etched with a width smaller than the width of insulating region 1222. By using a smaller trench width, the resulting trench depth is not as great due to etch lag effects. End point detection is an important part of this process to make sure that the insulating structure 1225 is exposed, but that not all of the remaining silicon 1227 is etched prior to hitting top oxide 1153. Leaving remaining silicon 1227 is helpful in increasing the strength of the resulting TSV structure 1224.

Figure 11H:
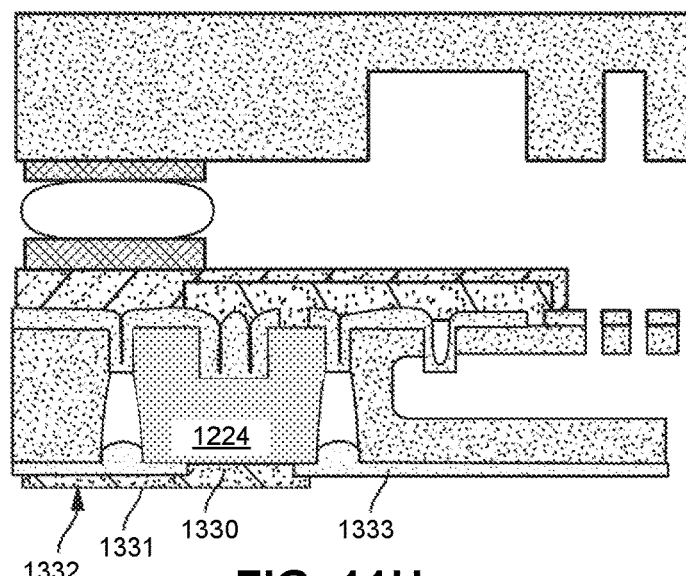

FIG. 11H illustrates an optional fabrication process step that would allow the dimensions of TSV structure 1224 to be shrunk and therefore lower the total system cost. In FIG. 11G, the size of bond pad 1221 is determined by the minimum size required by the packaging vendor to place a bond wire on the surface of pad 1221. If an insulating layer 1333 is deposited on the etched backside of substrate 1206, via opening 1330 could be opened in insulating layer 1333 and metal 1331 could be deposited and patterned to form a bond pad generally indicated in location 1332. This optional processing step may reduce the size of TSV structures 1224 and the total system cost. Additionally, wire bonding could take place in location 1332.

Figure 12:
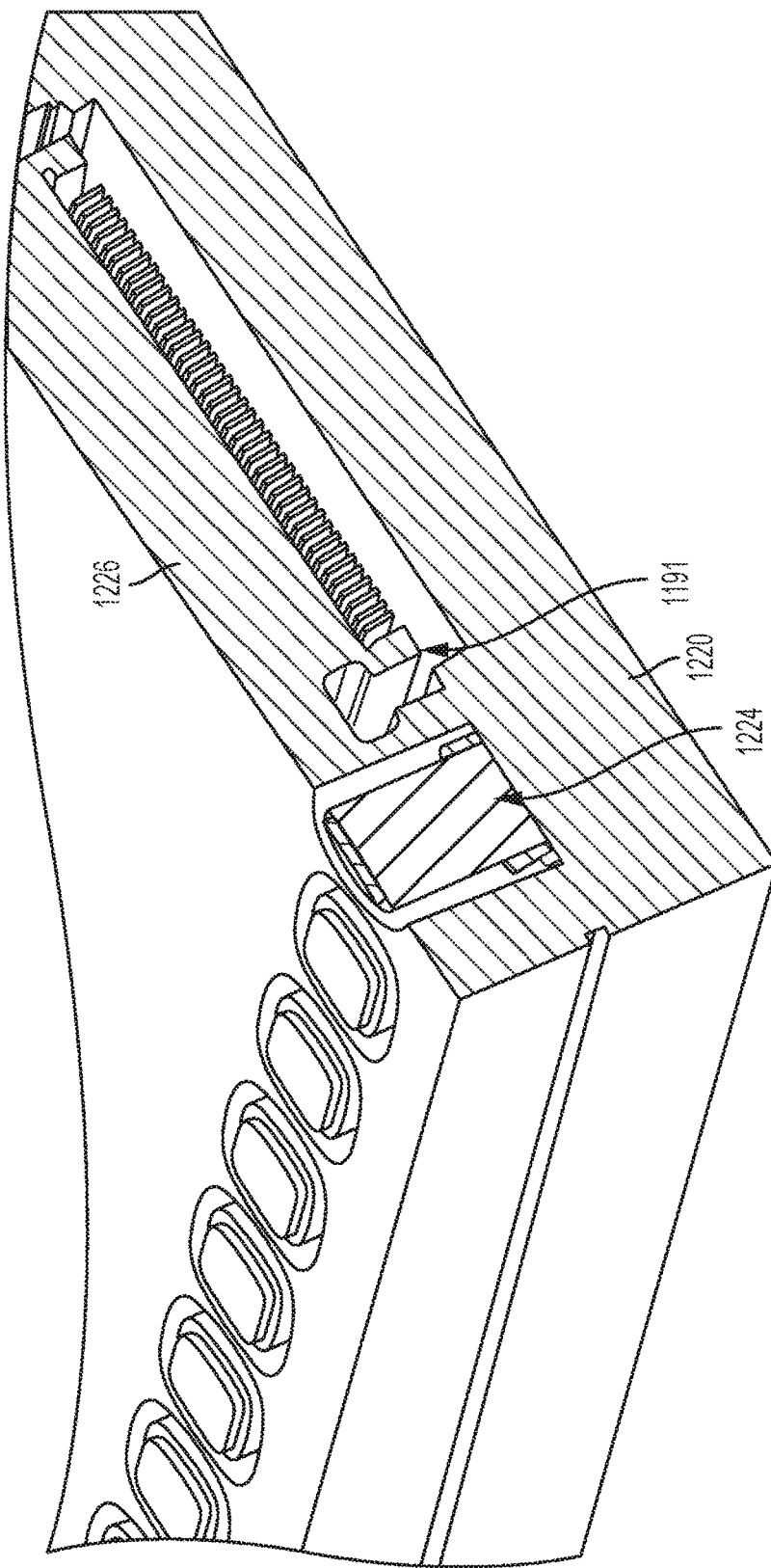
FIG. 12 shows a 3D rendering of a cross section of a microchip with a TSV and MEMS device, according to an embodiment.

FIG. 12 illustrates a 3D rendering of a microchip cross-section with a TSV 1224 and a MEMS device 1191, according to an embodiment. The lid 1200 and device substrate 1206 are bonded together. The cross-sectional view shows the TSV structure 1224 and the adjacent freestanding MEMS device 1191.

X. Conclusion

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the descrip-

What is claimed is:

1. A method of forming an interconnect in a substrate having a first surface and a second surface, the method comprising:
   forming an insulating structure abutting the first surface and defining a closed loop around a via in the substrate, the forming of the insulating structure comprising:
      etching the substrate beginning from the first surface to form a trench having a first depth in the substrate and to form a first portion of the substrate having a first height between the first depth and the first surface;
      filling the trench to form a seam portion, the seam portion having a first end and a second end opposite the first end; and
      converting the first portion of the substrate to a first solid portion to form the closed loop, the first solid portion separating the first and second ends of the seam portion; and
   forming an insulating region abutting the second surface such that the insulating region contacts the insulating structure and separates the via from a bulk region of the substrate,
   wherein the filling and the converting comprises thermally oxidizing the substrate to grow a thermal oxide, and
   wherein the filling and the converting occurs during the same processing step.

2. The method of claim 1, further comprising:
   disposing an insulating material in a lower portion of the insulating region, and over a first portion of the bulk region on the second surface; and
   disposing a conductive material over the lower portion, the first portion of the bulk region, and a first portion of the via to form a pad region.

3. The method of claim 2, wherein the pad region is greater than a cross-sectional area of the via along the second surface.

4. The method of claim 1, wherein the etching the substrate beginning from the first surface to form the trench comprises reactive ion etching.

5. The method of claim 1, wherein the thermal oxide is silicon dioxide.

6. The method of claim 1, wherein the forming the insulating region abutting the second surface comprises reactive ion etching.

7. The method of claim 1, further comprising converting a second portion of the substrate to a second solid portion to form the closed loop.

8. The method of claim 7, wherein the converting the first portion of the substrate to the first solid portion to form the closed loop and the converting the second portion of the substrate to the second solid portion to form the closed loop occurs during the same processing step.

9. The method of claim 1, wherein the forming the insulating region comprises forming a first insulating region portion abutting the insulating structure, and forming a second insulating region portion abutting the second surface and the first insulating region portion.

10. The method of claim 9, wherein the forming the first insulating region portion comprises forming a gaseous-material-filled volume abutting the insulating structure, and
   wherein the forming the second insulating region portion comprises forming a solid insulating layer abutting the gaseous-material-filled volume.

11. The method of claim 9, further comprising forming a pad region over a portion of the via and the second insulating portion, and wherein the forming the second insulating region portion comprises forming the second insulating portion over a portion of the bulk region.

12. The method of claim 11, wherein the pad region has a cross-sectional width greater than a cross-sectional width of the via.

13. The method of claim 1, further comprising:
   forming a conductive trace electrically connecting the via to a portion of the bulk region of the substrate; and
   forming a micro-electromechanical system (MEMS) structure in the portion of the bulk region of the substrate,
   wherein the portion of the bulk region is semiconducting.

14. The method of claim 1, wherein the first portion of the substrate is a vertical pillar separating, in a plan view, a first end and a second end opposite the first end of the trench.

15. A method of forming an interconnect, the method comprising:
   etching a first surface of a substrate to form a first trench having a first depth in the substrate and to form a first portion of the substrate having a first height between the first depth and the first surface adjacent a conductive portion of the substrate;
   thermally oxidizing the substrate to (a) fill the first trench with an insulating oxide and (b) convert the first portion of the substrate adjacent an end of the first trench to a first solid insulating oxide portion, wherein the insulating oxide filling the first trench and the first solid insulating oxide portion form, at least in part, a closed loop insulating structure surrounding the conductive portion of the substrate, and wherein the insulating oxide filling the first trench and the first solid insulating oxide portion are formed during the same thermal oxidizing processing step; and
   etching a second surface of the substrate to form an etched region surrounding the conductive portion of the substrate and to expose a surface of the closed loop insulating structure surrounding the conductive portion of the substrate, thereby electrically isolating the conductive portion of the substrate from a portion of the substrate outside the closed loop insulating structure.

16. The method of claim 15, wherein etching the first surface of the substrate further comprises forming a second trench adjacent the conductive portion of the substrate;
   wherein oxidizing the substrate further comprises (a) filling the second trench with the insulating oxide and (b) converting a second portion of the substrate adjacent an end of the second trench to a second solid insulating oxide portion; and wherein the insulating oxide filling the first and second trenches, the first solid insulating oxide portion, and the second solid insulating oxide portion form, at least in part, the closed loop insulating structure surrounding the conductive portion of the substrate.

17. The method of claim 15, further comprising:

forming a conductive trace electrically connecting the conductive portion of the substrate to the portion of the substrate outside the closed loop insulating structure; and forming a MEMS structure in the portion of the substrate outside the closed loop insulating structure.

18. The method of claim 15, wherein the first portion of the substrate is a vertical pillar separating, in a plan view, a first end and a second end opposite the first end of the first trench.

\* \* \* \* \*